United States Patent [19]

Matsubara et al.

[11] Patent Number: 5,258,258
[45] Date of Patent: Nov. 2, 1993

[54] PROCESS FOR MAKING LITHOGRAPHIC PRINTING PLATES

[75] Inventors: Eiji Matsubara; Hidetoshi Miura; Takimi Hashimoto, all of Nagaokakyo, Japan

[73] Assignee: Mitsubishi Paper Mills Limited, Tokyo, Japan

[21] Appl. No.: 774,611

[22] Filed: Oct. 10, 1991

[30] Foreign Application Priority Data

Oct. 11, 1990 [JP] Japan .................................. 2-273707
Oct. 11, 1990 [JP] Japan .................................. 2-273708
Oct. 18, 1990 [JP] Japan .................................. 2-280145

[51] Int. Cl.$^5$ .......................... G03C 5/54; G03C 5/38
[52] U.S. Cl. ..................................... 430/204; 430/233; 430/251; 430/248; 430/455; 430/456; 430/459
[58] Field of Search ............... 430/204, 233, 251, 248, 430/455, 456, 459, 489

[56] References Cited

U.S. PATENT DOCUMENTS 4,251,617  2/1981  Bloom et al. .................... 430/251
4,297,429  10/1981 Kanada et al. ................... 430/204

Primary Examiner—Richard L. Schilling
Attorney, Agent, or Firm—Cushman, Darby & Cushman

[57] ABSTRACT

Disclosed is a processing solution used for making lithographic printing plates by silver complex diffusion transfer process which contains at least one thioether derivative represented by the following formulas (I), (II) and (III):

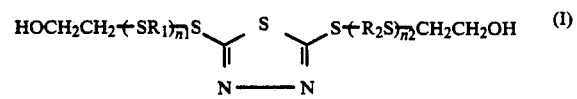

wherein $n_1$ and $n_2$ each represents 0, 1 or 2 and $R_1$ and $R_2$ each represents an alkylene group of 1-5 carbon atoms,

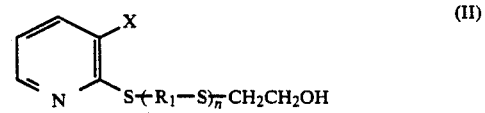

wherein $R_1$ represents an alkylene group of 1-5 carbon atoms, X represents a hydrogen atom, a carboxy group, an alkoxycarbonyl group, a carbamoyl group, a hydroxy group, or $-OR^2$ in which $R^2$ has the same meaning as $+R_1-S)_{\overline{n}}CH_2CH_2OH$ above, and n represents 0, 1 or 2, $$X'-S+R_1-S)_{\overline{n}}R_2-S-X' \quad (III)$$

wherein X' represents an aromatic or heterocyclic group which has a carboxy group, $R_1$ and $R_2$ each represents an alkylene group of 1-5 carbon atoms and n represents 0, 1, 2 or 3.

1 Claim, No Drawings

PROCESS FOR MAKING LITHOGRAPHIC PRINTING PLATES

BACKGROUND OF THE INVENTION

The present invention relates to a developer used for making lithographic printing plates by silver complex diffusion transfer process.

Printing plates which use silver images obtained by silver complex diffusion transfer process (DTR process) which is one of photographic reproduction methods as offset printing master plates are disclosed in U.S. Pat. No. 3,857,112.

According to a typical silver complex diffusion transfer process suitable for making these lithographic printing plates, a light-sensitive material which comprises a support and a subbing layer which serves also as an antihalation layer, a silver halide emulsion layer and a physical development nuclei layer provided on said support is exposed imagewise and developed, whereby silver halide of latent image area becomes black silver by chemical development in the emulsion layer and simultaneously silver halide of non-latent image area is dissolved by the action of a silver halide complexing agent contained in a processing solution and diffuses to the surface of the light-sensitive material. The thus dissolved and diffusing silver complex salt is deposited on the physical development nuclei in the surface layer by reducing action of developing agent. Following the development, if necessary, the material is subjected to sensitizing treatment to increase ink-receptivity of the silver image. Then, the thus obtained lithographic printing plate is mounted on an offset printing machine and the inked image is transferred to a printing paper.

Various properties required for the printing plates depend on printing materials and besides, depend greatly on plate making steps, especially development processing step. That is, the influence of properties of silver image produced by diffusion transfer on printing characteristics is important. For example, conditions for formation of transfer silver grains such as diffusion rate, stability and reducing rate of silver complex salt are important factors. Furthermore, U.S. Pat. Nos. 4,297,429, 4,297,403 and 4,355,090 show that kind of silver halide solvents has an important influence on the conditions for formation of transfer silver grains. However, there have been found few silver complexing agents which are fully satisfactory.

SUMMARY OF THE INVENTION

The object of the present invention is to provide a processing solution used for making lithographic printing plates by silver complex diffusion transfer process, especially a processing solution for obtaining direct printing plates which exhibit excellent printing plate wear.

The above object has been attained by using a processing solution containing at least one thioether derivative represented by the following formulas (I), (II) and (III) as a silver halide solvent in making lithographic printing plates by silver complex diffusion transfer process.

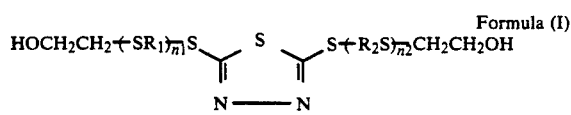

[wherein $n_1$ and $n_2$ each represents 0, 1 or 2 and $R_1$ and $R_2$ each represents an alkylene group of 1-5 carbon atoms (preferably, ethylene, propylene, tetramethylene or the like)].

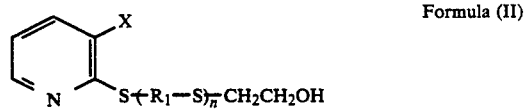

[wherein $R_1$ represents an alkylene group of 1-5 carbon atoms (such as ethylene, propylene, tetramethylene or the like), X represents a hydrogen atom, a carboxyl group, an alkoxycarbonyl group (such as methoxycarbonyl, ethoxycarbonyl or the like), a carbamoyl group, a hydroxy group, or $—OR_2$ in which $R_2$ is the same as $—R_1—S)_{\overline{n}}CH_2CH_2OH$ in the formula (II), and n represents 0, 1 or 2].

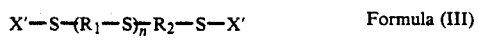

(wherein X' represents an aromatic group (preferably aryl group) or heterocyclic group (such as pyridine ring, thiazole ring, oxazole ring, imidazole ring, or the like) which has a carboxy group, $R_1$ and $R_2$ each represents an alkylene group of 1-5 carbon atoms (preferably ethylene, propylene, tetramethylene or the like), and n represents 0, 1, 2 or 3).

DESCRIPTION OF THE INVENTION

Typical examples of the thioether derivatives used in the present invention are shown below.

Examples of compounds of the formula (I):

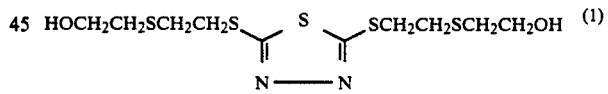

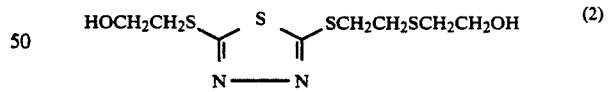

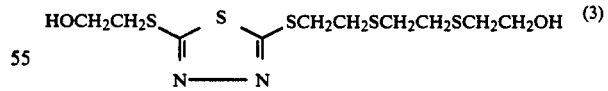

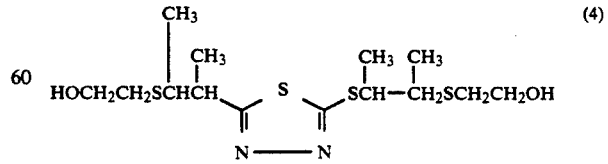

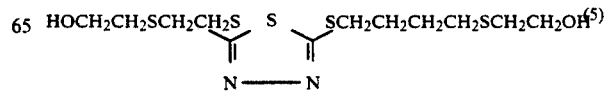

-continued
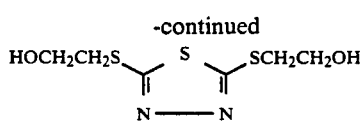 (6)
Examples of compounds of the formula (II):
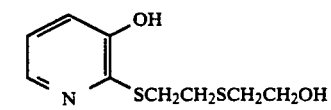 (7)
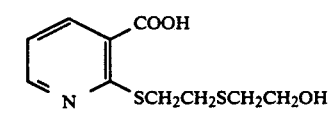 (8)
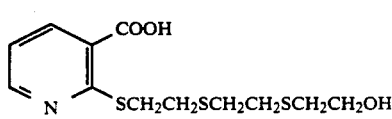 (9)
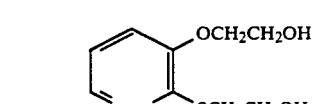 (10)
-continued
 (11)
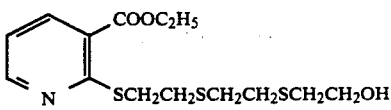 (12)
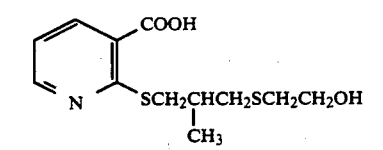 (13)
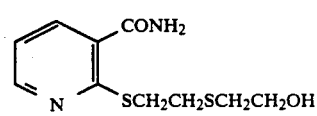 (14)
Examples of compounds of the formula (III):
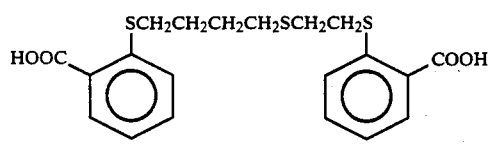 (15)
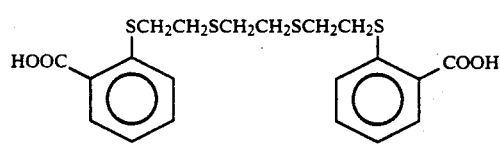 (16)
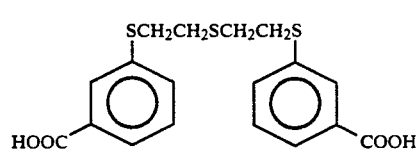 (17)
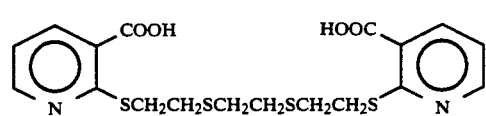 (18)
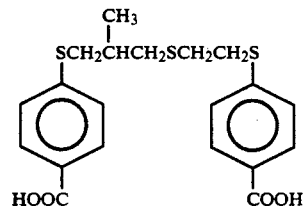 (19)
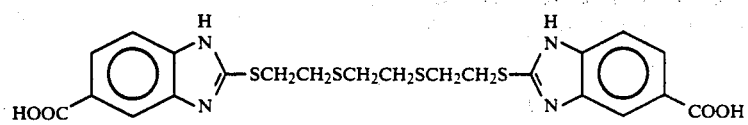 (20)

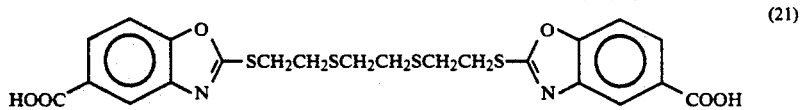

(21)

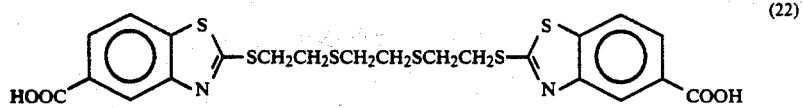

(22)

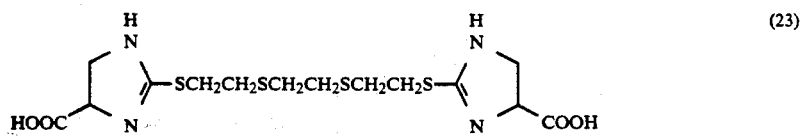

(23)

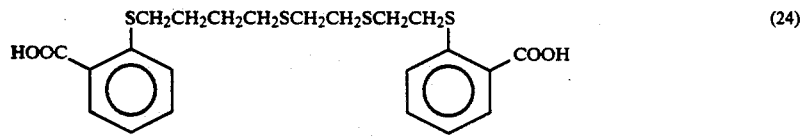

(24)

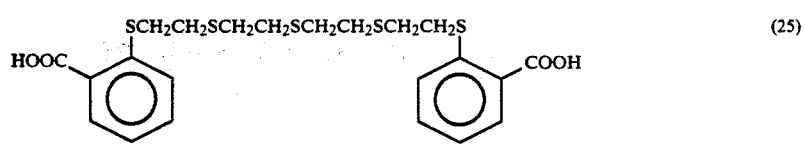

(25)

Synthesis of the thioethers used in the present invention is basically carried out by alkylation of corresponding thiols. Alkylating agents can be easily synthesized by the process mentioned, for example, in "Journal of Organic Chemistry" (J.O.C.), 26, 4897 (1961).

Details of process for synthesis will be explained by synthesis examples.

SYNTHESIS EXAMPLE 1

Synthesis of Compound (1) exemplified above 1.5 g of 2,5-dimercapto-1,3,4-thiadiazole was dissolved in 30 ml of ethyl alcohol and thereto was added 2.2 g of triethylamine, followed by adding 2.8 g of 2-chloro-2'-hydroxydiethyl sulfide. After refluxing for 3 hours, the reaction mixture was poured into water and extracted with ethyl acetate. Then, the ethyl acetate layer was washed with water and dried over anhydrous sodium sulfate. After evaporation under reduced pressure, the residue was separated by a column chromatograph (chloroform/methanol=3/1). The desired fraction was collected and evaporated under reduced pressure to obtain 2.51 g of colorless oil.

CMR (CDCl$_3$)δ 164.8, 61.2, 34.8, 35.8, 31.3.

Synthesis Example 2

Synthesis of Compound (8)

1.6 g of 2-mercaptonicotinic acid was dissolved in 30 ml of ethyl alcohol and thereto was added 1.1 g of triethylamine, followed by adding 1.4 g of 2-chloro-2'-hydroxydiethyl sulfide. After refluxing for 3 hours, the reaction mixture was poured into water and extracted with chloroform. Then, the chloroform layer was washed with water and dried over anhydrous sodium sulfate. After evaporation under reduced pressure, the residue was separated by a silica gel column chromatograph (chloroform/methanol=3/1). The desired fraction was collected and evaporated under reduced pressure and the residual solid was recrystallized from ethyl acetate and n-hexane to obtain 1.5 g of a white powder having a melting point of 83°-84.5° C.

CMR (DMSO) δ166.3, 160.0, 151.8, 139.0, 123.2, 118.7, 60.9, 33.9, 30.1, 29.8.

SYNTHESIS EXAMPLE 3

Synthesis of Compound (16)

1.5 g of thiosalicylic acid was dissolved in 30 ml of ethanol and thereto was added 1.1 g of triethylamine, followed by adding 1.2 g of 3,6-dithia-1,8-octane dichloride. After refluxing for 3 hours, the residual solid was collected by filtration, washed with water, dried and then recrystallized from methyl alcohol to obtain a white powder.

m.p.: 228°-230° C., yield: 1.8 g.

CMR (DMSO) δ167.2, 139.5, 131.9, 130.6, 128.8, 125.6, 123.9, 31.5, 29.9.

Amount of the thioether derivative to be contained in the processing solution in the present invention is generally about 5 g/l - about 50 g/l, preferably about 10 g/l - about 30 g/l.

The processing solution of the present invention may contain alkaline substances such as sodium hydroxide, potassium hydroxide, lithium hydroxide, and sodium tertiary phosphate; preservatives such as sulfites; silver halide solvents such as thiosulfates, thiocyanates, cyclic imides, thiosalicylic acid, and amines; thickening agents such as hydroxyethylcellulose and carboxymethylcellulose; antifoggants such as potassium bromide, 1-phenyl-5-mercaptotetraxole and compounds described in U.S. Pat. No. 3,776,728; developing agents such as hydroquinone and 1-phenyl-3-pyrazolidone; and developing modifiers such as polyoxyalkylene compound and onium compounds.

In carrying out the silver complex diffusion transfer process, the developing agent may be contained in the silver halide emulsion layer and/or the image receiving layer or other water permeable layers contiguous thereto as described in British Patent Nos. 1,00,115, 1,012,476, 1,017,273 and 1,042,477. Therefore, in such case, "alkaline activating solution" which contains no developing agent is used in the developing step.

The silver halide emulsion in the lithographic printing plates used for practice of the present invention may be silver chloride, silver bromide, silver chlorobromide, silver chloroiodide, silver chlorobromoiodide and the like and preferred are silver halides containing at least 50 mol % of silver chloride. These silver halide emulsions may contain spectral sensitizers (spectral sensitizing dyes depending on light source and use, such as those of camera type, laser beam type and color separation panchromatic type), gelatin hardeners, coating aids, anti-foggants, plasticizers, developing agents, matting agents and the like.

As binders for silver halide emulsions, there may be used natural and/or synthetic binders customarily used for this purpose, such as gelatin, colloidal aubumin, and cellulose derivatives.

A subbing layer for improving adhesion and/or an undercoat layer for anti-halation may be provided below the silver halide emulsion layer (and above the support). This undercoat layer may further contain a developing agent and/or a matting agent.

The support to be coated with silver halide emulsion may be paper, various films, plastics, papers coated with resinous substances, metals and the like.

Physical development unclei used in the physical development nuclei layer are known and examples thereof are metals such as antimony, bismuth, cadmium, cobalt, palladium, nickel, silver, lead and zinc and sulfides thereof. This physical development nuclei layer may also contain the developing agent and hydrophilic binders.

The lithographic printing plates made in accordance with the present invention can be rendered ink receptive or enhanced in ink receptivity by use of such compounds as described in U.S. Pat. No. 3,721,539.

The printing method, etch solution and dampening solution used may be those which are known to the art.

The present invention will be explained in detail by the following nonlimiting examples.

EXAMPLE 1

On one side of a subbed polyester film support, was provided a matting layer containing powdered silica of $5\mu$ in average particle size. On another side, was provided an antihalation undercoat layer (adjusted to pH 4.0) containing carbon black in such an amount as to provide a light reflectance of 3% to 633 nm and 20% by weight based on the photographic gelation of powdered silica of 7 $\mu m$ in average particle size. On this undercoat layer was provided a high sensitivity silver chloride emulsion layer (adjusted to pH 4.0) containing 5% by weight based on photographic gelatin of powdered silica of 7 $\mu m$ in average particle size, which had been chemically sensitized and then spectrally sensitized.

The application rate of gelatin in the undercoat layer was 3.5 g/m², that of gelatin in the emulsion layer was 0.8 g/m² and that of silver halide in terms of silver nitrate was 1.0 g/m². These undercoat layer and emulsion layer contained 5.0 mg/g gelatin of formaldehyde as a hardener. After drying, the coated support was heated at 40° C. for 14 days. Then, on the emulsion layer was coated a nuclei coating composition described in U.S. Pat. No. 4,160,670 (plate No. 4 in Example 1), followed by drying to make a light-sensitive material for a lithographic printing plate. The above-mentioned silver halide emulsion contained $4 \times 10^{-6}$ mol of rhodium chloride for 1 mol of silver halide which had been added during physical ripening and had an average grain size of $0.40\mu$.

The thus obtained light-sensitive material for lithographic printing plate was exposed imagewise by a process camera having an image reversal mechanism and developed with the following developer A (as used) at 30° C. for 30 seconds and subsequently treated with the following neutralizing solution.

| Developer A (comparative) | |
|---|---|
| Sodium hydroxide | 24 g |
| Potassium hydroxide | 8 g |
| Anhydrous sodium sulfite | 50 g |
| 3-Mercapto-4-acetamido-5-n-heptyl-1,2,4-triazole | 0.15 g |
| 2-Methyl-2-amino-1-propanol | 30 g |
| Uracil | 0.2 g |
| Water to make up 1 liter in total. | |
| Neutralizing solution | |
| Ethylene glycol | 5 g |
| Colloidal silica (20% aqueous solution) | 1 g |
| Citric acid | 10 g |
| Sodium citrate | 35 g |
| Water to make up 1 liter in total. | |

Separately, a lithographic printing plate was made in the same manner as above except for using Developer B which was prepared by using 10 g of Compound (1) exemplified hereabove in place of 2-methyl-2-amino-1-propanol in the above comparative Developer A. As another comparative sample, a printing plate was made in the same manner as above using 3,6-dithia-1,8-octanediol as a comparative compound (Developer C).

Each of the thus obtained printing plates was set on an offset printing machine and an etch solution of the following composition was applied to allover the surface of the plate and printing was carried out with using a dampening solution of the following composition.

| Etch solution | |
|---|---|
| Water | 600 ml |
| Isopropanol | 400 ml |
| Ethylene glycol | 50 g |
| 3-Mercapto 4-acetamido-5-n-butyl-1,2,4-triazole | 1 g |
| Dampening solution (diluted tenfold with water in use) | |
| Water | 800 ml |
| Succinic acid | 6 g |
| Sodium sulfate | 25 g |
| Ethylene glycol | 100 g |
| Colloidal silica (20% aqueous solution) | 28 g |

The printing machine was A. B. Dick 350 CD (Trademark for offset printing machine of A. B. Dick Co.).

In the case of the printing plates made using Developers A and C, the transfer silver image partially peeled off before printing of 5000 copies while the transfer silver image did not peel off even after printing of 10,000 copies in the case of the printing plate made using Developer B of the present invention.

There was no difference in ink-receptivity in these printing plates.

EXAMPLE 2

Printing plates were made in the same manner as in Example 1 except that 20 g of Compound (2) or (3) was used in place of 2-methyl-2-amino-1-propanol in the comparative Developer A. No peeling off of transfer silver image occurred even after printing of 10,000 copies.

EXAMPLE 3

Printing plates were made in the same manner as in Example 1 except for using the following developer containing 15 g of Compound (1), (2), (3), (4) or (5). The resulting printing plates were excellent as those of Examples 1 and 2.

| Developer | |
|---|---|
| Sodium hydroxide | 20 g |
| Anhydrous sodium sulfite | 80 g |
| Hydroquinone | 12 g |
| 1-Phenyl-3-pyrazolidone | 2 g |
| Potassium bromide | 2 g |
| 3-Mercapto-4-acetamide-5-n-heptyl-1,2,4-triazole | 0.1 g |
| Water to make up 1 liter in total. | |

EXAMPLE 4

A printing plate was made in the same manner as in Example 1 except for using Developer D prepared using 10 g of Compound (8) in place of 2-methyl-2-amino-1-propanol in the comparative Developer A. No peeling off of transfer silver image was seen even after printing of 10,000 copies.

EXAMPLE 5

Example 4 was repeated except for using 20 g of compound (7) or (10) in place of compound (8) to obtain the same results as in Example 4.

EXAMPLE 6

Printing plates were made in the same manner as in Example 3 except for using 15 g of Compound (7), (8), (10), (12), or (14). The resulting printing plates were excellent as those of Examples 3.

EXAMPLE 7

A printing plate was made in the same manner as in Example 1 except for using Developer E prepared using 10 g of Compound (14) in place of 2-methyl-2-amino-1-propanol in the comparative Developer A.

Separately, a comparative printing plate made using Developer C (containing 3,6-dithia-1,8-octanediol) in Example 1 was prepared.

Printing was conducted in the same manner as in Example 1.

In the case of the printing plate made using developer C, partial peeling off of transfer silver image occurred before printing of 5000 copies while no peeling off of transfer silver image occurred even after printing of 10,000 copies in the case of the printing plate made using Developer E of the present invention. Moreover, no difference was seen in ink-receptivity.

EXAMPLE 8

Printing plates were made in the same manner as in Example 1 except for using a developer prepared using 20 g of Compound (15) or (18) in place of 2-methyl-2-amino-1-propanol in the comparative Developer A. No peeling off of transfer silver image occurred in these printing plates even after printing of 10,000 copies.

EXAMPLE 9

Example 3 was repeated except for using 15 g of Compound (15), (16), (17), (18), (19) or (20) in the developer. The resulting printing plates were excellent as in those of Example 3.

As is clear from the above explanation, lithographic printing plates made using the developer of the present invention are improved in the problem of peeling off of transfer silver image during printing and are markedly improved in printing endurance. Ink-receptivity is also superior.

What is claimed is:

1. A method for making a lithographic printing plate which comprises imagewise exposing lithographic printing plate comprising a support and at least a silver halide emulsion layer and a physical development nuclei layer provided in this order on the support and then developing it with a processing solution containing at least one thioether derivative represented by the following formulas (I), (II) and (III):

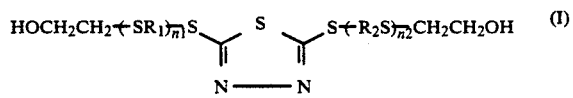

wherein $n_1$ and $n_2$ each represents 0, 1 or 2 and $R_1$ and $R_2$ each represents an alkylene group of 1–5 carbon atoms,

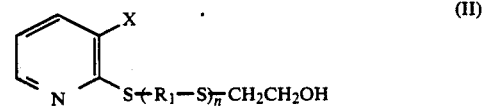

wherein $R_1$ represents an alkylene group of 1–5 carbon atoms, X represents a hydrogen atom, a carboxyl group, an alkoxycarbonyl group, a carbamoyl group, a hydroxy group, or $-OR^2$ in which $R^2$ has the same meaning as $-(R_1-S)_{\overline{n}}CH_2CH_2OH$, and n represents 0, 1 or 2

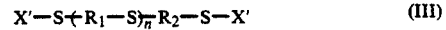

wherein X' represents an aromatic or heterocyclic group which has a carboxy group, $R_1$ and $R_2$ each represents an alkylene group of 1–5 carbon atoms and n represents 0, 1, 2 or 3.

* * * * *